United States Patent
Ma

(10) Patent No.: US 8,045,595 B2
(45) Date of Patent: Oct. 25, 2011

(54) SELF ALIGNED DIODE FABRICATION METHOD AND SELF ALIGNED LASER DIODE

(75) Inventor: Yong Ma, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/600,618

(22) Filed: Nov. 15, 2006

(65) Prior Publication Data

US 2008/0112454 A1    May 15, 2008

(51) Int. Cl.
    *H01S 5/00*    (2006.01)
(52) U.S. Cl. ............ 372/45.011; 372/45.01; 372/43.01
(58) Field of Classification Search .............. 372/45.01, 372/45.011, 43.01
    See application file for complete search history.

(56) References Cited

U.S. PATENT DOCUMENTS

| | | | |
|---|---|---|---|
| 4,933,302 A * | 6/1990 | Costrini et al. ................ 438/23 |
| 5,592,501 A | 1/1997 | Edmond et al. ................ 372/45 |
| 5,838,706 A | 11/1998 | Edmond et al. ................ 372/45 |
| 6,046,464 A | 4/2000 | Schetzina ...................... 257/96 |
| 6,136,623 A * | 10/2000 | Hofstetter et al. ............. 438/28 |
| 6,744,800 B1 * | 6/2004 | Kneissl et al. ................ 372/50.1 |
| 6,825,502 B2 * | 11/2004 | Okazaki et al. ................ 257/98 |
| 6,833,564 B2 | 12/2004 | Shen ............................... 257/94 |
| 6,969,874 B1 * | 11/2005 | Gee et al. ........................ 257/98 |
| 7,170,111 B2 | 1/2007 | Saxler .......................... 257/194 |
| 7,176,612 B2 | 2/2007 | Omoto et al. ................. 313/487 |
| 7,679,101 B2 | 3/2010 | Ota et al. ...................... 257/100 |
| 7,820,075 B2 | 10/2010 | Li et al. .................... 252/301.4 F |
| 2003/0020069 A1 | 1/2003 | Holmes et al. ................. 257/76 |
| 2003/0138981 A1 * | 7/2003 | Yamaguchi et al. ........... 438/22 |
| 2003/0165169 A1 | 9/2003 | Nomoto et al. ................ 372/46 |
| 2006/0034576 A1 | 2/2006 | Merritt et al. ................ 385/129 |
| 2007/0025231 A1 | 2/2007 | Ochiai et al. ................. 369/122 |

FOREIGN PATENT DOCUMENTS

| | | |
|---|---|---|
| EP | 0936682 | 8/1999 |
| WO | WO 9856043 | 12/1998 |
| WO | WO 03080763 | 10/2003 |

* cited by examiner

*Primary Examiner* — Kinam Park
(74) *Attorney, Agent, or Firm* — Koppel, Patrick, Heybl & Philpott

(57) ABSTRACT

A method for fabricating a laser diode comprising providing a laser diode epitaxial structure and depositing a metal layer stack on the epitaxial structure, the stack comprising a contact and sacrificial layer. A ridge is formed in the laser diode epitaxial structure, the stack being the mask forming the ridge. An insulating layer is deposited over the ridge and at least a portion of the sacrificial layer is removed. At least a portion of the insulating thin film at the top of the stack is also removed. A pad metal is deposited in electrical contact with the contact and is insulated from the ridge and laser diode epitaxial structures by the insulating layer.

16 Claims, 4 Drawing Sheets

SELF ALIGNED DIODE FABRICATION METHOD AND SELF ALIGNED LASER DIODE

BACKGROUND OF THE INVENTION

1. Field of the Invention

This invention relates to laser diodes, and more particularly to nitride based semiconductor laser diodes and methods for fabricating same.

2. Description of the Related Art

A laser is a device that produces a beam of coherent light as a result of stimulated emission. Light beams produced by lasers can have high energy because of their single wavelength, frequency, and coherence. A number of materials are capable of producing a lasing effect and include certain high-purity crystals (such as ruby), semiconductors, certain types of glass, certain gasses including carbon dioxide, helium, argon and neon, and certain plasmas.

More recently there has been increased interest in lasers made of semiconductor materials because they typically have a smaller size, lower cost, and have other related advantages typically associated with semiconductor devices. Semiconductor lasers are similar to other lasers in that the emitted radiation has special and temporal coherence. Like other lasers, semiconductor lasers produce a beam of light that is highly monochromatic (i.e. of narrow bandwidth) and is highly directional. Overall, semiconductor lasers provide very efficient systems that are easily modulated by modulating the current directed across the devices. Additionally, because semiconductor lasers have very short photon lifetimes, they can be used to produce high-frequency modulation.

A known characteristic of laser diodes (and light emitting diodes (LEDs)) is that the frequency of radiation that can be produced by the particular laser diode is related to the bandgap of the particular semiconductor material. Smaller bandgaps produce lower energy, shorter wavelength photons, while wider bandgaps produce higher energy, shorter wavelength photons. One semiconductor material commonly used for lasers is indium gallium aluminum phosphide (InGaAlP), which has a bandgap that is generally dependant upon the mole of atomic fraction of each element present. This material, regardless of the different element atomic fraction, produces only light in red portion of the visible spectrum, i.e., about 600 to 700 nanometers (nm).

Laser diodes that produce shorter wavelengths not only produce different colors of radiation, but offer other advantages. For example, laser diodes, and in particular edge emitting laser diodes, can be used with optical storage and memory devices (e.g. compact disks (CD) digital video disks (DVD), high definition (HD) DVDs, and Blue Ray DVDs). Their shorter wavelength enables the storage and memory devices to hold proportionally more information. For example, an optical storage device storing information using wavelengths of light in the blue spectrum can hold approximately 32 times the amount of information as one using wavelengths of light in the red spectrum, using the same storage space. This has generated interest in Group-III nitride material for use in laser diodes, and in particular gallium nitride for producing light in the blue and ultra violet (UV) frequency spectrums because of its relatively high bandgap (3.36 eV at room temperature). This interest has resulted in developments related to the structure and fabrication of Group-III nitride based laser diodes [For example see U.S. Pat. Nos. 5,592,501 and 5,838,706 to Edmond et al].

Some edge emitting laser diodes are fabricated with a ridge etched formed in the laser diode's top surface, and in some embodiments, the ridge is etched from the top surfaces of the laser diode, down approximately to the laser diode's active region. The ridge provides electrical and optical confinement, as well as index-guiding for the particular wavelength of light generated by the laser diode. This in turn allows for laser diode operation at lower threshold currents and voltages. These ridges, can be relatively thin, with some ridges being 2 µm or less wide.

The improved operating characteristics achieved by formation of these thin ridges come at the cost of more complex fabrication processes, and in particular more difficult and complex ridge contact deposition. The ridge is typically formed through at least some of the laser diode's p-type layers, which can include the p-type cap layer, waveguide cladding layers, and separate confinement heterostructure. The ridge can be etched through all or some of these layers and can be narrow relative to the overall size of the laser diode and can run down most of the length of the laser diode.

Once the fabrication processes are completed to form the ridge, a p-contact layer must be formed on the top of the ridge with typical p-contact layers made from different combination of nickel, gold and platinum (Ni/Au/Pt). The p-contact layer should electrically contact primarily the top of the ridge to avoid shorting to the layers below. One conventional contacting process is known in the art as the "via process" and involves photolithograph and alignment processes that are designed to align with the ridge for p-contact deposition. These processes, however, are complex and difficult to repeat reliably. This is particularly true for narrow ridges such as those with a width of 2 µm or less. Devices where the alignment is not accurate during fabrication can fail, decreasing the overall yield for the manufacturing process.

Another conventional contacting process is known in the industry as "$SiO_2$ liftoff" and involves using a thick $SiO_2$ layer as the etch mask layer. This process also requires photolithography and alignment steps that can be difficult for narrow ridges. This process also involves depositing and etching a number of different layers, with the result being that the process can be costly, time consuming and unreliable.

Another consideration in contacting the ridge is that the top layer of the ridge is typically formed of a p-type material. This material can be unstable and different environment conditions can damage the surface of the layer. It can be desirable to protect this surface from environmental conditions during processing. The "via process" and "$SiO_2$ liftoff" process described above can expose the p-type material to environmental conditions that can result in damage to the material.

SUMMARY OF THE INVENTION

The present invention is generally directed to self-alignment methods for contacting a ridge in a semiconductor structure and in particular, for contacting the ridge in a laser diode. The present invention is also directed to laser diodes contacted using the methods.

One embodiment of a laser diode according to the present invention comprises a laser diode epitaxial structure having a ridge with mesas on the sides of the ridge. A p-contact is on the ridge, and an insulating layer covers the exposed surfaces of the ridge, and at least a portion of the mesas. A pad metal is on the insulating layer and in electrical contact with the p-contact. The pad metal is also insulated from the surfaces of the ridge and mesas by the insulating layer.

Another embodiment of a laser diode according to the present invention comprises a laser diode epitaxial structure having a ridge, with a contact on the ridge. An insulating thin film on the laser diode epitaxial structure has at least a portion of the contact not covered by the insulating thin film. A pad metal is on the laser diode epitaxial structure, the pad metal is in electrical contact with the contact and the pad metal is electrically insulated from the surfaces of laser diode epitaxial structure by the insulating thin film.

One embodiment of a method for fabricating a laser diode according to the present invention comprises providing a laser diode epitaxial structure and depositing a metal layer stack on the epitaxial structure, the stack comprising a contact and sacrificial layer. A ridge is formed in the laser diode epitaxial structure, the stack being the mask forming the ridge. An insulating layer is deposited over the ridge and at least a portion of the sacrificial layer is removed. At least a portion of the insulating thin film at the top of the stack is also removed. A pad metal is deposited in electrical contact with the contact and the pad metal is insulated from the ridge and laser diode epitaxial structures by the insulating layer.

These and other further features and advantages of the invention will be apparent to those skilled in the art from the following detailed description, taken together with the accompanying drawings.

DETAILED DESCRIPTION OF THE INVENTION

Figure 1:
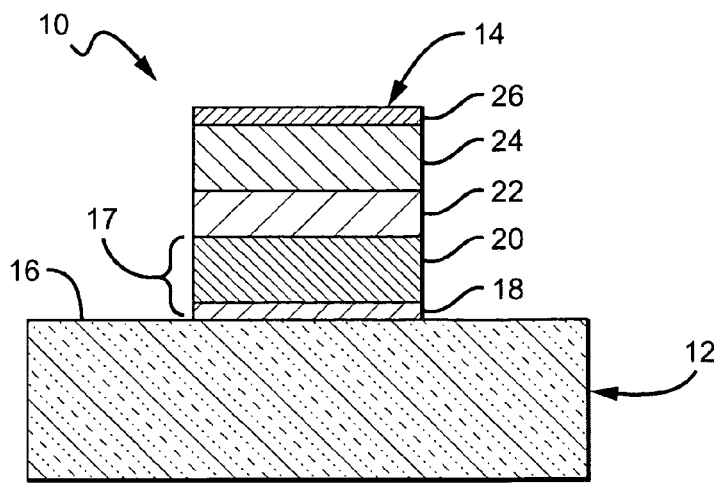
FIG. 1 is sectional view of one embodiment of a laser diode according to the present invention metal layer stack on an epitaxial laser diode structure.

The present invention provides an improved self-alignment method for contacting laser diode ridges that allows for contacting laser diode ridges without complex and unreliable alignment processes. The present invention also discloses laser diodes that can be contacts formed using methods according to the present invention. It is understood that the present invention is described with reference to laser diodes, but that it is equally applicable for use with other semiconductor devices having a ridge or similar structure.

In one embodiment according to the present invention, a multi-layer stack of metals is deposited on the surface of the laser diode prior to etching to form the ridge. The stack can be formed using many different methods, with a suitable method being known as lithography and liftoff techniques. The stack has approximately the same width that is desired for the ridge, and serves both as a mask for etching the ridge and as protection for the epitaxial layer under the stack. The ridge can be etched in the laser diode with the stack of metals remaining on top of the ridge after etching is completed.

A dielectric (passivation) layer can then be deposited over the stack, covering at least some of the exposed surfaces of the ridge and the top surface of the laser diode (mesas) on the sides of the ridge. The stack also comprises a sacrificial layer used for lift-off at least a portion of the dielectric layer on top of the stack. The sacrificial layer is then exposed to a process that removes the at least a portion of the sacrificial layer. This in turn causes the removal of a portion of the dielectric layer at the top of the stack, while leaving the remainder of the dielectric layer. A pad metal can then be deposited over the ridge and the area on the sides of the ridge with the contact metal being insulated from the laser diode by the dielectric layer, except on top of the stack where the dielectric layer has been removed. On top, the pad metal makes contact with the remainder of the metal stack, which can comprise the p-contact.

The present invention solves many of the problems presented by previous contacting methods. The process protects the p-GaN surface below the metal stack from environmental conditions that can damage or degrade the surface. By forming the p-contact at the very first step the surface of the semiconductor material under the contact is protected from damage, which significantly improves the p-contact quality of GaN devices. The present invention can be used to fabricate any size of ridge width. Traditional via processes present difficulties with narrow ridge widths, such as less than 2 μm. Instead of alignment processes for vias, the present invention uses a sacrificial layer and is relatively quick and simple because it requires no alignment and instead uses a relatively short wet etch process. The present invention also differs from $SiO_2$ liftoff processes because it deposits the p-contact metal first instead of using this $SiO_2$ (1-2 μm). This shortens the process and makes the p-contact more robust.

The present invention is described herein with reference to certain embodiments but it is understood that the invention can be embodied in many different forms and should not be construed as limited to the embodiments set forth herein. It is also understood that when an element or component is referred to as being "on", "connected to" or "coupled to" another layer, element or component, it can be directly on, connected to or coupled to the other layer element or component, or intervening elements may also be present. Furthermore, relative terms such as "inner", "outer", "upper", "above", "lower", "beneath", and "below", and similar terms, may be used herein to describe a relationship of one component or element to another. It is understood that these terms are intended to encompass different orientations of the device in addition to the orientation depicted in the figures.

Although the terms first, second, etc. may be used herein to describe various layers, elements, components and/or sections, these layers, elements, components, and/or sections should not be limited by these terms. These terms are only used to distinguish one layer, element, component, or section from another. Thus, a first layer, element, component, or section discussed below could be termed a second element, component, or section without departing from the teachings of the present invention.

Embodiments of the invention are described herein with reference to cross-sectional view illustrations that are schematic illustrations of idealized embodiments of the invention.

It is understood that many of the layers will have different relative thicknesses compared to those shown and that the laser diodes will have different shapes. Further, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Embodiments of the present invention may be particularly well suited for use in nitride-based devices such as Group III-nitride based laser diodes. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. As well understood by those in this art, the Group III elements can combine with nitrogen to form binary (e.g., GaN), ternary (e.g., AlGaN and AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$, where $0 \leq x \leq 1$, are often used to describe them.

Referring now to the drawings and in particular FIG. 1, a laser diode 10 is shown comprising a laser structure 12. For ease of illustration the laser structure 12 is shown without showing the specific laser diode epitaxial layers. It is understood, however, that the laser structure can comprise known laser diode layers and features including but not limited to contacting layers, active region, waveguiding elements and separate confinement heterostructures.

According to the present invention, the laser diode 10 further comprises a multi layer stack 14 of metal layers on the laser diode's top surface 16. The top surface 16 typically comprises a p-type contact layer (not shown), although it is understood that the top surface can also be a surface of other layers. The metal layer stack 14 covers a portion of the top surface corresponding to the desired width of the laser diode ridge, with the stack serving as a mask for etching the ridge as further described below.

Many different metals of different thicknesses can be used for the stack 14, and the metals can be deposited using many different methods including known lithography and liftoff. In the embodiment shown the stack 14 comprises a p-contact 17 that in the embodiment shown comprises a thin platinum (Pt) layer 18 that can be different thicknesses but is preferably approximately 50 nanometers (nm) thick. The p-contact 17 further comprises a first gold (Au) layer 20 formed on the Pt layer 18 that has a preferred thickness of approximately 200 nm. The Pt layer 18 and first Au layer 20 serve as p-contact 17 to the top surface 16 of the laser structure 12, and although these elements are shown as two separate and distinct layers it is understood that they can comprise additional layers or the elements can be mixed. As mentioned above, by depositing the p-contact 17 on the top surface 18 (usually p-type GaN) the surface can be protected during subsequent processing steps.

A first protection layer 22 is included on the Au layer for protecting the Pt and Au layers 18, 20 (that form p-contact metal) from being damaged during subsequent etching or lift-off processes. Many different elements and materials alone or in combination and having different thicknesses can be used for the protection layer 22. A preferred element for the first protection layer is nickel (Ni) having a thickness of approximately 50 nm.

A sacrificial layer 24 is included on the protection layer 22 and can also comprise different elements and materials alone or in combination and having different thicknesses. In the embodiment shown, the sacrificial layer 24 comprises a second Au layer that is removed during subsequent lift-off processes to expose the p-contact 17 or the first protection layer 22 below. The stack 14 finally comprises a second protection layer 26 on the sacrificial layer 24 that can be different elements and can have different thicknesses. In the embodiment shown, the second protection layer 26 comprises a second Ni layer that is approximately 10 nm thick. The second protection layer protects the sacrificial layer during etching of the ridge and deposition of the dielectric/passivation layer as described below.

Figure 2:
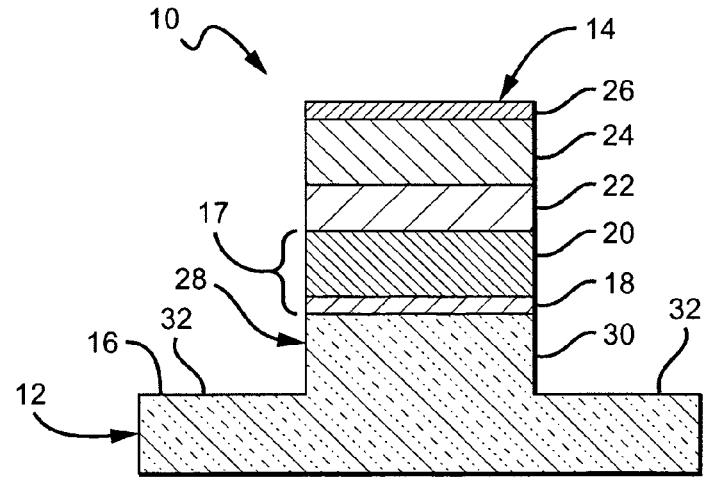
FIG. 2 is a sectional view of the laser diode in FIG. 1, after etching to form a ridge.

Referring now to FIG. 2, the stack 14 serves as the mask for formation of the ridge 28 that facilitates optical and electrical confinement in operation of the laser diode 10. The ridge 28 can be formed using many different processes with a suitable process being plasma reactive ion etching (RIE). The ridge can be etched to different depths in the laser structure 12 and typically results in exposing side surfaces 30 of the ridge 28 that can comprise layers of the laser structure 12, and exposes mesas 32 on both sides of the ridge 28.

Figure 3:
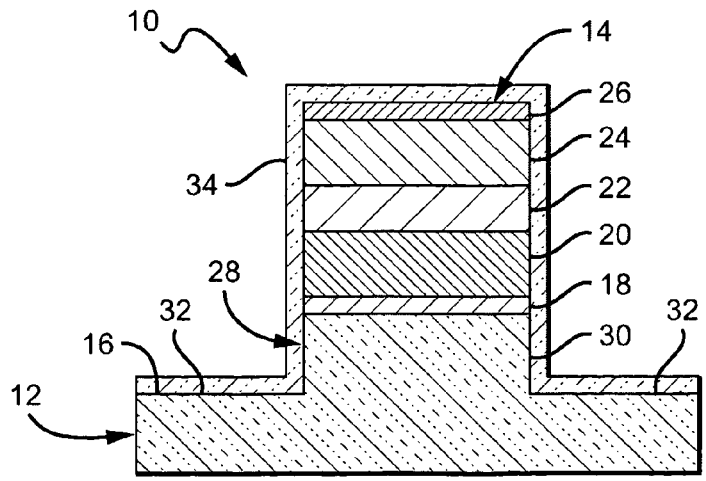
FIG. 3 is a sectional view of the laser diode in FIG. 2 with an insulating layer.

Referring now to FIG. 3, an insulating layer 34 is deposited on the laser diode after the ridge is formed and typically covers the stack 14, the ridge side surfaces 30 and at least part of the mesas 32. The insulating layer 34 can comprise many different materials, with the preferred material being a layer of dielectric (insulating) thin film that also serves as a passivation layer. A suitable material for the insulating layer is silicon dioxide ($SiO_2$), although other materials can also be used, with a suitable thickness being approximately 200 nm.

Figure 4:
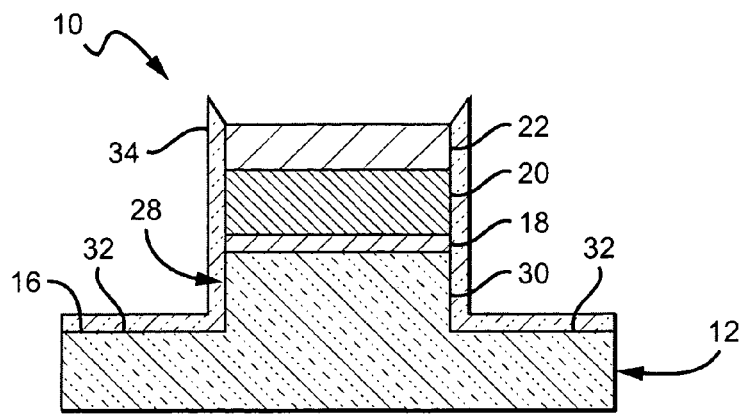
FIG. 4 is a sectional view of the laser diode in FIG. 3 after etching of a sacrificial layer.

Referring to FIG. 4, the diode is exposed to a process to remove the sacrificial layer 24, and along with it the second protection layer 26 and a portion of the insulating layer 34 at the top of the stack 14. Many different removal process can be used, with the preferred process tailored to the particular element(s) or material(s) used for the sacrificial layer 24. For the laser diode 10, the sacrificial layer 24 comprises Au and can be removed using removal processes tailored to Au, such as known Au wet etchant solutions. For sacrificial layers of different elements or materials a corresponding wet etchant can also be used. The Au sacrificial layer 24 is exposed to the etchant for a sufficient amount of time so that essentially all or most of the sacrificial layer 24 and the layers above, including the second protection layer 26 and the portion of the insulating layer 34 at the top of the stack 14, are removed. This leaves primarily either the top surface of the p-contact 17 or the top surface of the first protection layer 22 exposed. In the embodiment shown, at least part of the first protection layer 22 remains, although in other embodiments it can be removed to expose the top surface of the p-contact 17.

In the embodiment shown (as well as those shown in FIGS. 5-7 and 10), the insulating layer 34 is shown after etching as having peaks or extensions above the top surface of the what remains of the stack 14. These peaks can remain depending on the thickness and material used for the insulating layer, as well as the processing steps used. In some embodiments, the peaks will not be present with the insulating layer being at substantially the same height as the top layer of the stack. In other embodiments the peaks may be present but in different shapes or sizes.

Figure 5:
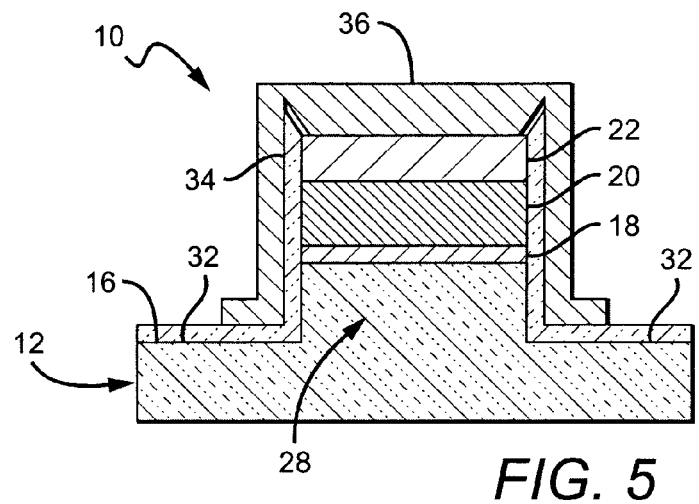
FIG. 5 is a sectional view of the laser diode in FIG. 4 with a pad metal.

Referring now to FIG. 5, a pad metal 36 can then be deposited over the stack 14, the ridge side surfaces 30 and the at least part of the mesas 32. The pad metal can comprise many different conductive materials, with a suitable material being Au. The pad metal 36 is deposited in relation to the insulating layer 34 so that the insulating layer on the mesa 32 and the side surfaces 30 is included between the pad metal 36 and the surface below. The pad metal 36 is also in ohmic contact with the top surface of the stack 14, which as shown is the first protection layer 22. This arrangement ensures that the pad metal is only in contact with the p-contact 17 and insulated from the other surfaces by the insulating layer 34. This allows for a p-contact 17 and pad metal to be formed without complex and unreliable alignment processes. Electrical contact can then be made to the pad metal such as by wire bonding.

Figure 6:
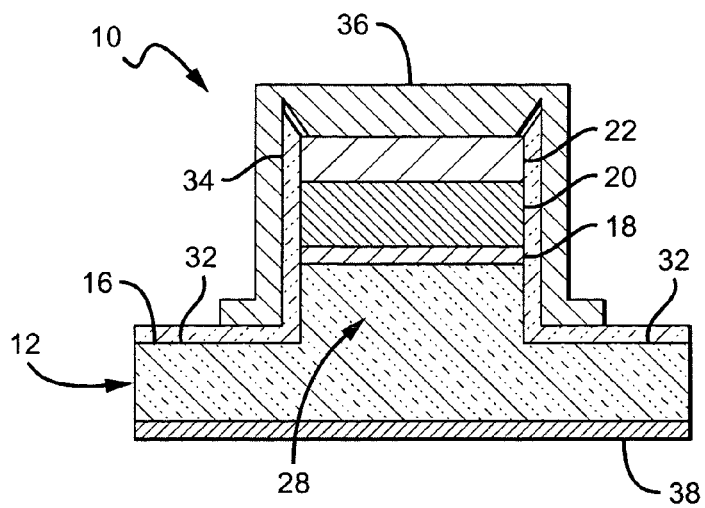
FIG. 6 is a sectional view of the laser diode in FIG. 5 with a n-contact layer.

Referring now to FIG. 6, an n-contact 38 can be included on the laser diode 10, and as shown is deposited on the bottom surface of the laser diode 10 in a vertical geometry arrangement. This is generally referred to as backside metal deposition, and for typical laser diodes, the bottom layer is the substrate, and the n-contact 38 can be deposited as shown for conductive substrates. Contact can then be made to the n-contact 38, such as through a wire bond, or contact can be made to the n-contact through a submount or printed circuit board. The n-contact 38 can be made of many different conductive materials, with suitable materials being metals such Ni, Au, Cu and Pt, either alone or in combination. It is understood that this n-contact arrangement can also be used with other laser diodes according to the present invention. For example, the substrate can be removed from the laser diode and the n-contact can then be made to the bottom exposed surface of the laser diode epitaxial layers. Current can then spread from the n-contact into the epitaxial layers without first passing through the substrate.

Figure 7:
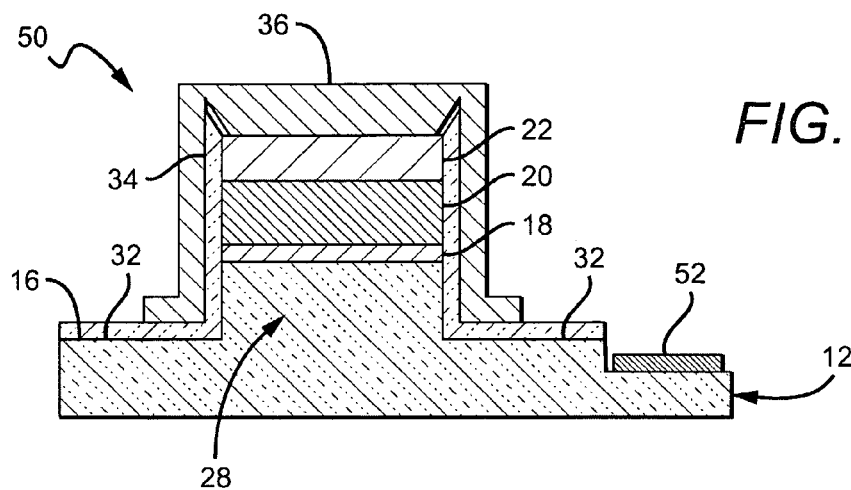
FIG. 7 is a sectional view of the laser diode in FIG. 6 with n-contact deposited in a lateral geometry.

FIG. 7 shows another embodiment of a laser diode 50 similar to the laser diode 10 in FIGS. 1-6, of for similar features the same reference number from FIGS. 1-6 is used herein. The laser diode 50 is shown after removal of the sacrificial layer and comprises a laser structure 12, p-contact 17, a protection layer 33, insulating film 32 and a pad metal 36. This laser diode 50, however, has a lateral geometry typically utilized when the laser diode has a substrate that does not efficiently conduct electricity, such as when the substrate is insulating or semi-insulating. When the substrate does not efficiently conduct electricity, the n-contact typically cannot be deposited on the substrate. Instead, a portion of the laser diode 50 can be removed, such as by known etching processes, down to an n-contact layer (not shown) to form an n-contact mesa on the n-contact layer. An n-contact contact 52 can then be deposited on the mesa using known deposition techniques, and electrical contact can be made to the n-contact 52 such as through a wire bond (not shown). The n-contact layer is typically made of a material that allows for efficient conduction of current from the n-contact 52, through the n-contact layer, and to the active region of the laser diode 50.

Figure 8:
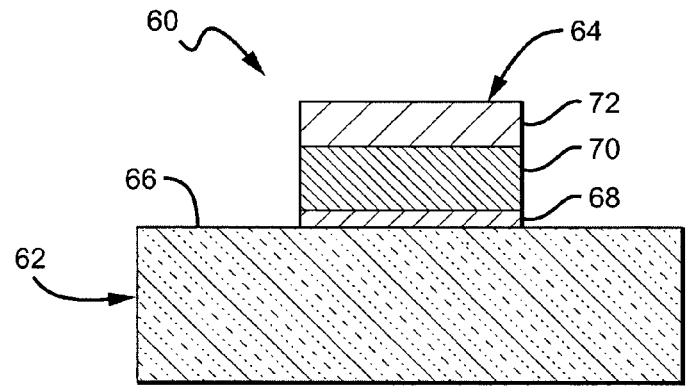
FIG. 8 is a sectional view of another embodiment of a laser diode according to the present invention.

As mentioned above, many different metal layer arrangements can be used in the stack and many different materials can be used according to the present invention. FIG. 8 shows another embodiment laser diode 60 having a laser diode structure 62 and a metal layer stack 64 deposited on the top surface 66 of the laser diode structure 62. The stack 64 has a Pt layer 68 on the top surface 66, with and Au layer 70 and Ni (protection) layer 72 formed successively on the Pt layer 68. The Pt and Au layers 68, 70 form the p-contact with the Au layer 68 also being the sacrificial layer. The Ni layer 72 protects the Au and Pt layers 68, 70 during ridge formation etching and during deposition of a dielectric insulating thin film.

Figure 9:
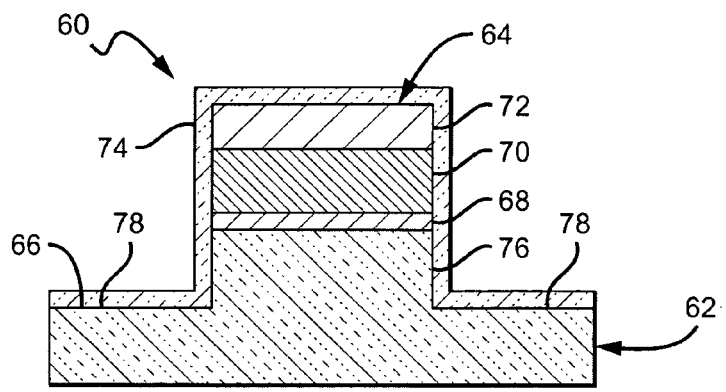
FIG. 9 is a sectional view of the laser diode in FIG. 8 with following etching to form a ridge.
Figure 10:
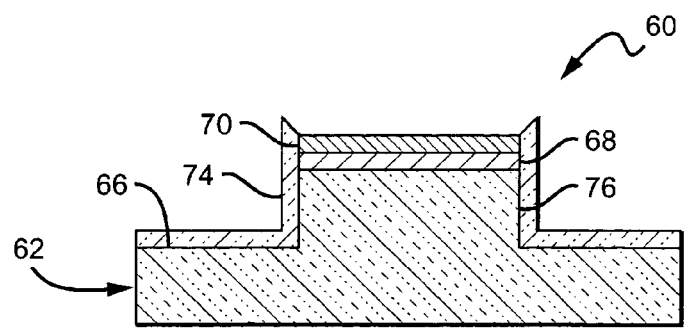
FIG. 10 is a sectional view of the laser diode in FIG. 9 after etching of a sacrificial layer.

Referring now to FIG. 9, the laser diode 60 is etched to form a ridge 76 with the stack 64 serving as the etching mask. Mesas 78 are formed on the sides of the ridge 76 and a dielectric thin film is deposited over the stack 64, exposed surfaces of the ridge 76 and at least a portion of the mesas 78. Referring now to FIG. 10, the diode 60 is then exposed to a process that removes at least a portion of the Au layer 74, along with the protection layer 72 and a portion of the insulating layer 74 at the top of the stack 64. Many different removal processes can be used such as known Au wet etchant solutions. Typically, a portion of the Au layer 70 layer should remain over the Pt layer 68 following etching, so the etching of the laser diode 60 may require more specific etch time parameters and controls. Following etching, a pad metal (not shown) can be deposited over the stack, and a portion of the mesas, with the thin film 74 insulating the pad metal from the ridge 76 and mesas 78 except on top of the stack 64. An n-contact (not shown) can be included in either vertical or lateral geometry and electrical contact can be made to the pad metal and n-contact as described above.

Figure 11:
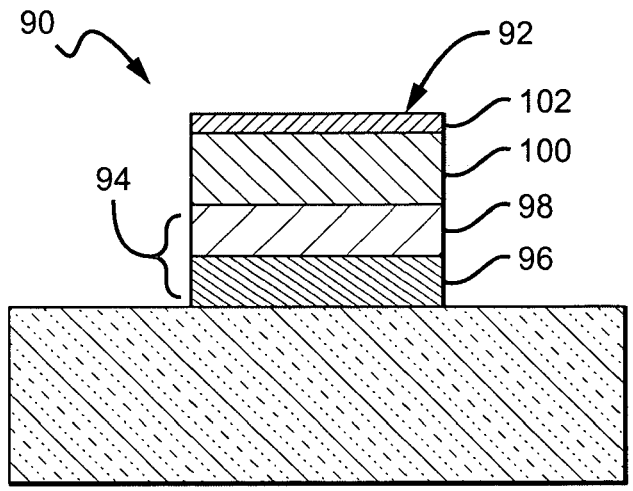
FIG. 11 is a sectional view of still another embodiment of a laser diode according to the present invention.

FIG. 11 shows still another laser diode 90 illustrating alternative materials that can be used for the metal layer stack 92 according to the present invention. The stack comprises a p-contact 94 that can be arranged in many different ways with many different materials and is shown as having a first layer 96 that can comprise palladium (Pd), Pt or Ni, either alone or in combination with Au layer 98 on the first layer 96. A sacrificial layer 100 is included on the p-contact 94 that can comprise different materials suitable for deposition on the p-contact 94 and also suitable for removal, such as by etching. Different materials can be used such as Chromium (Cr), titanium (Ti), germanium (Ge), aluminum (Al) and copper (Cu), either alone or in combination. A protection layer 102 can the be included on the sacrificial layer 102 to protect the sacrificial layer 102 and the p-contact 94 during ridge etching and deposition of the dielectric thin film as described above. The sacrificial layer 100 can then be at least partially removed, such as by an etch tailored to the sacrificial layer material, to remove the protection layer 102 and the portion of the dielectric film at the top of the stack 92. A pad metal and n-contact can then be deposited as described above.

Figure 12:
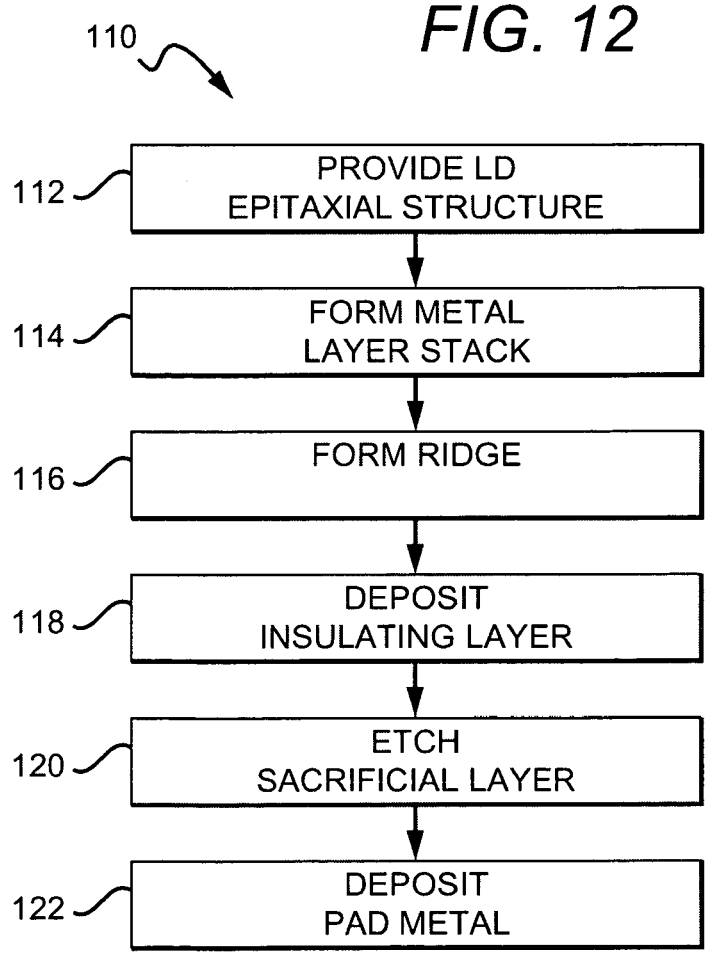
FIG. 12 is a flow diagram for one embodiment of a method for fabricating a laser diode according to the present invention.

FIG. 12 shows a flow diagram for one embodiment of a method 110 for fabricating a laser diode according to the present invention. In 112 a laser diode epitaxial structure is provided that can comprise different epitaxial layers arranged in different ways and can include but is not limited to, contacting layers, active region, waveguiding elements and separate confinement heterostructures. In 112 a stack of metal layers is deposited on the top surface of the laser diode epitaxial structure, and the stack can include different metal layers such as those described above in FIGS. 1-11. The metal stack typically includes a p-contact that can include one or more metals in separate layers or combined, and a sacrificial layer. The stack can also include one or more protection layers to protect other layers in the stack during etching and material deposition.

In 116 a ridge is formed in the laser diode epitaxial structure by known processes such as etching, with the stack serving as the etching mask. After etching a ridge remains with mesas on the sides of the ridge and the stack on the top surface of the ridge. In 118 an insulating thin film is deposited over the ridge and at least a portion of the mesas on the sides of the ridge. In 120 the sacrificial layer is etched using etching processes that efficiently etch the sacrificial layer material as described above. This etch step removes at least a portion of the sacrificial layer, and preferably most or all of it. The layers above the sacrificial layer, along with at least part of the insulating film at the top of the stack are also removed and the p-contact remains. In 122 a pad metal is deposited over the ridge that is in electrical contact with the p-contact but is insulated from other surfaces of the laser diode epitaxial surfaces, such as the surfaces ridge and mesas, by the insulating thin film. An n-contact can then be deposited in one of the locations as described above, and electrical contact can be made to the pad metal and n-contact as also described above.

Although the present invention has been described in considerable detail with reference to certain preferred configurations thereof, other versions are possible. Therefore, the spirit and scope of the appended claims should not be limited to their preferred versions contained therein.

I claim:

1. A laser diode, comprising:
   a laser diode epitaxial structure comprising a ridge with mesas on the sides of said ridge, said ridge having a top surface and side surfaces, said ridge comprising a metal p-contact and a protection layer on said p-contact;
   an insulating layer covering said side surfaces of said ridge; and
   a pad metal on said insulating layer and in electrical contact with said p-contact through said top surface of said ridge, said pad metal on said side surfaces of said ridge and insulated from said side surfaces of said ridge by said insulating layer.

2. The laser diode of claim 1, wherein said ridge provides optical and electrical confinement during laser diode operation.

3. The laser diode of claim 1, wherein said laser diode epitaxial structure is made from the Group-III nitride material system.

4. The laser diode of claim 1, wherein said insulating layer comprises a dielectric material.

5. The laser diode of claim 1, wherein said protection layer comprises one or more metals.

6. The laser diode of claim 1, wherein said p-contact comprises gold (Au) and platinum (Pt).

7. The laser diode of claim 1, wherein said pad metal comprises gold (Au).

8. A laser diode, comprising:
   a laser diode epitaxial structure comprising a ridge having a top surface and side surface, said ridge comprising a metal p-contact and a means for protecting said p-contact during fabrication of said diode;
   an insulating thin film on said laser diode epitaxial structure at least a portion of said top surface of said ridge not covered by said insulating thin film; and
   a pad metal on said laser diode epitaxial structure, said pad metal in electrical contact with said p-contact through said top surface of said ridge, said pad metal electrically insulated from said side surfaces of said ridge by said insulating thin film.

9. The laser diode of claim 8, further comprising mesas at the base of and on both sides of said ridge, at least a portion of said mesas covered by said insulating layer such that said mesas are insulated from said pad metal.

10. The laser diode of claim 8, wherein said ridge provides optical and electrical confinement during laser diode operation.

11. The laser diode of claim 8, wherein said laser diode epitaxial structure is made from the Group-III nitride material system.

12. The laser diode of claim 8, wherein said insulating thin film comprises a dielectric material.

13. The laser diode of claim 8, wherein said p-contact comprises gold (Au) and platinum (Pt).

14. The laser diode of claim 8, wherein said pad metal comprises gold (Au).

15. The laser diode of claim 8, wherein said p-contact comprises one or more elements from group comprising gold, palladium, platinum and nickel.

16. A solid state emitter, comprising:
    an epitaxial structure comprising a ridge with mesas on the sides of said ridge, said ridge having a top surface and side surfaces;
    a p-contact on said ridge;
    an insulating layer covering said side surfaces of said ridge and no more than a portion of said top surface of said ridge; and
    a pad metal on said insulating layer and in electrical contact with said p-contact through said top surface of said ridge, said pad metal running from one of said side surfaces, over said top surface to another of said side surfaces, and insulated from said side surfaces of said ridge and said mesas by said insulating layer.

* * * * *